United States Patent
Minarik et al.

(10) Patent No.: US 7,474,351 B2
(45) Date of Patent: *Jan. 6, 2009

(54) SOLDER REFLUX METHOD FOR HOLDING CRYOGENICALLY ALIGNED PARTS

(75) Inventors: Philip R. Minarik, Schaumburg, IL (US); Robin H. Pruss, Steamwood, IL (US); Sung-Shik Yoo, Palatine, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 812 days.

This patent is subject to a terminal disclaimer.

(21) Appl. No.: 10/967,053

(22) Filed: Oct. 15, 2004

(65) Prior Publication Data

US 2006/0082681 A1    Apr. 20, 2006

(51) Int. Cl.
*H04N 5/225* (2006.01)
*G02B 13/16* (2006.01)
*H01L 25/00* (2006.01)

(52) U.S. Cl. .................. 348/340; 348/335; 250/332

(58) Field of Classification Search ................. 348/335, 348/360; 396/71; 250/33
See application file for complete search history.

(56) References Cited

U.S. PATENT DOCUMENTS

| 5,075,201 A | | 12/1991 | Koh |
| 5,479,015 A | | 12/1995 | Rudman et al. |
| 5,502,309 A | * | 3/1996 | Davis .......................... 250/353 |
| 5,742,384 A | * | 4/1998 | Farmer .................... 356/141.4 |
| 6,518,656 B1 | * | 2/2003 | Nakayama et al. .......... 257/680 |
| 6,828,545 B1 | * | 12/2004 | Hamilton et al. ......... 250/214.1 |
| 7,332,720 B2 | * | 2/2008 | Minarik et al. .............. 250/352 |

* cited by examiner

*Primary Examiner*—Nhan T. Tran
*Assistant Examiner*—Trung Diep
(74) *Attorney, Agent, or Firm*—Stetina Brunda Garred & Brucker

(57) ABSTRACT

A method of aligning a lens assembly to a focal plane array is provided. The method may comprise the steps of providing an upper cold shield which holds the lens assembly, providing a lower cold shield for holding the focal plane array, mounting the upper cold shield onto the lower cold shield, lowering the temperature of the upper and lower cold shield to a cryogenic level, translating the upper cold shield with respect to the lower cold shield until the lens assembly is aligned to the focal plane array while the upper and lower cold shields are at the cryogenic temperature levels, and fixing the upper cold shield to the lower cold shield while the upper and lower cold shields are maintained at cryogenic levels.

19 Claims, 4 Drawing Sheets

SOLDER REFLUX METHOD FOR HOLDING CRYOGENICALLY ALIGNED PARTS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates in general to a cold shield assembly, and more particularly, to a lower cold shield aligned and fixed an upper cold shield while the cold shields are lowered to a cryogenic temperature.

Infrared (IR) imaging systems function on the basis that all objects constantly emit IR radiation as a function of their temperature. The radiated IR light may be picked up by sophisticated electronic equipment (e.g., thermal imaging devices) which converts the picked up IR to an electrical signal to be displayed on a video monitor, analyzed by computer or recorded on film. The electronic equipment that picks up the radiated IR light is capable of detecting differences in radiated IR light among different objects of a scanned scene.

Imaging applications in which IR imaging systems are used have created a need to increase the ability of sophisticated electronic equipment to detect minute irradiance differences in objects located in a scene. To this end, thermal imaging devices that are cryogenically cooled have been engineered and fabricated. These cryogenically cooled thermal imaging devices are currently available in the market. The advantage of such a device is increased resolution and sensitivity. For example, cryogenically cooled devices can detect temperature differences as low as 0.2° F. (i.e., 0.1° C.) from more than one thousand feet (300 meters) away.

Non-Imaging applications that use a single focal plane to view several fields can take advantage of the cooled focal plane technology. In these applications single focal planes can be divided by external or internal optics to split the field of view into two or more discrete locations on the focal plane. A robust example of this technology is one in which the cold shield incorporates the optical element that is responsible for dividing the fields.

To fabricate these cryogenically cooled devices, the lens assembly is typically aligned and fixed to the focal plane array at ambient temperature. The alignment therebetween must be maintained while the focal plane array and the lens assembly are cooled to cryogenic temperature levels. To this end, the lens assembly and focal plane array are aligned while at ambient temperature, cooled to cryogenic temperature levels and the alignment therebetween is checked. If the alignment therebetween is not satisfactory, then the focal plane array and the lens assembly are heated to ambient temperature, the focal plane array and lens assembly is repositioned with respect to each other based on the checked alignment. Thereafter, the focal plane array and the lens assembly are cooled to cryogenic temperature level and the alignment therebetween is checked again. The process is reiterated until the alignment between the focal plane array and the lens assembly is satisfactory.

Problems associated with this reiterative process are as follows. First, the time required to align the lens assembly and the focal plane array may be time consuming. In particular, each cycle of positioning, cooling, checking and heating to ambient temperatures may take hours. Second, the alignment accuracy obtainable through this process may be insufficient for certain applications which require even more perfectly aligned lens assembly and focal plane array than that which is achievable with the above-mentioned process. In particular, as stated above, the lens assembly and focal plane array are fixed to each other at ambient temperatures. The lens assembly and focal plane array are subsequently cooled to cryogenic levels and the alignment therebetween is checked. The problem with this process is that as the lens assembly and focal plane array are cryogenically cooled, these parts contract according to their coefficient of thermal expansion. This introduces variables in the alignment process which are inherent thereto and may not be eliminated.

Accordingly, there is a substantial need to provide a new method by which the lens assembly may be aligned to the focal plane array with a greater accuracy than the alignment obtainable when the lens assembly is fixed to the focal plane array at ambient temperatures.

BRIEF SUMMARY OF THE INVENTION

In accordance with the present invention, there is provided a methodology fixing and aligning a lens assembly precisely to a focal plane array at cryogenic temperature levels. Generally, the method includes the step of aligning the lens assembly with the focal plane array and fixing the same while maintained at cryogenic temperature levels. In this regard, when the lens assembly and focal plane array are heated to ambient temperature levels, the deformation, contraction or expansion between the two parts due to the coefficient of thermal expansion of the physical material holding (e.g., upper and lower cold shields) the lens assembly to the focal plane array will be exactly proportional to the deformation, contraction or expansion when the focal plane array and lens assembly are cooled down to cryogenic temperature levels.

The physical structure which holds the lens assembly aligned to the focal plane array may be a lower cold shield and an upper cold shield. The upper and lower cold shield may have cylindrical walls wherein the lower cold shield cylindrical wall is slidably insertable into the upper cold shield cylindrical wall. In this regard, the upper cold shield has full freedom to rotate about a Z axis as well as translate along the Z axis. Further, the upper cold shield on an inner surface of the cylindrical wall may have a plurality of bumps formed thereon. The lower cold shield may have formed on an outer surface of the cylindrical wall a plurality of pads which are sized, configured and positioned to receive the plurality of bumps. These bumps and pads may further be coated with indium solder such that when the upper cold shield is aligned to the lower cold shield such that there is precise alignment between the lens assembly and focal plane array, the coated indium solder may be re-flowed to attached the upper and lower cold shields. Moreover, the aligning and fixing may be accomplished while the upper and lower cold shields, lens assembly and focal plane array are maintained at cryogenic temperature levels. Preferably, a localized heat via a laser may be applied to each of the bumps in a symmetrical manner.

BRIEF DESCRIPTION OF THE DRAWINGS

An illustrative and presently preferred embodiment of the present invention is shown in the accompanying drawings in which.

DETAILED DESCRIPTION OF THE INVENTION

Figure 1:
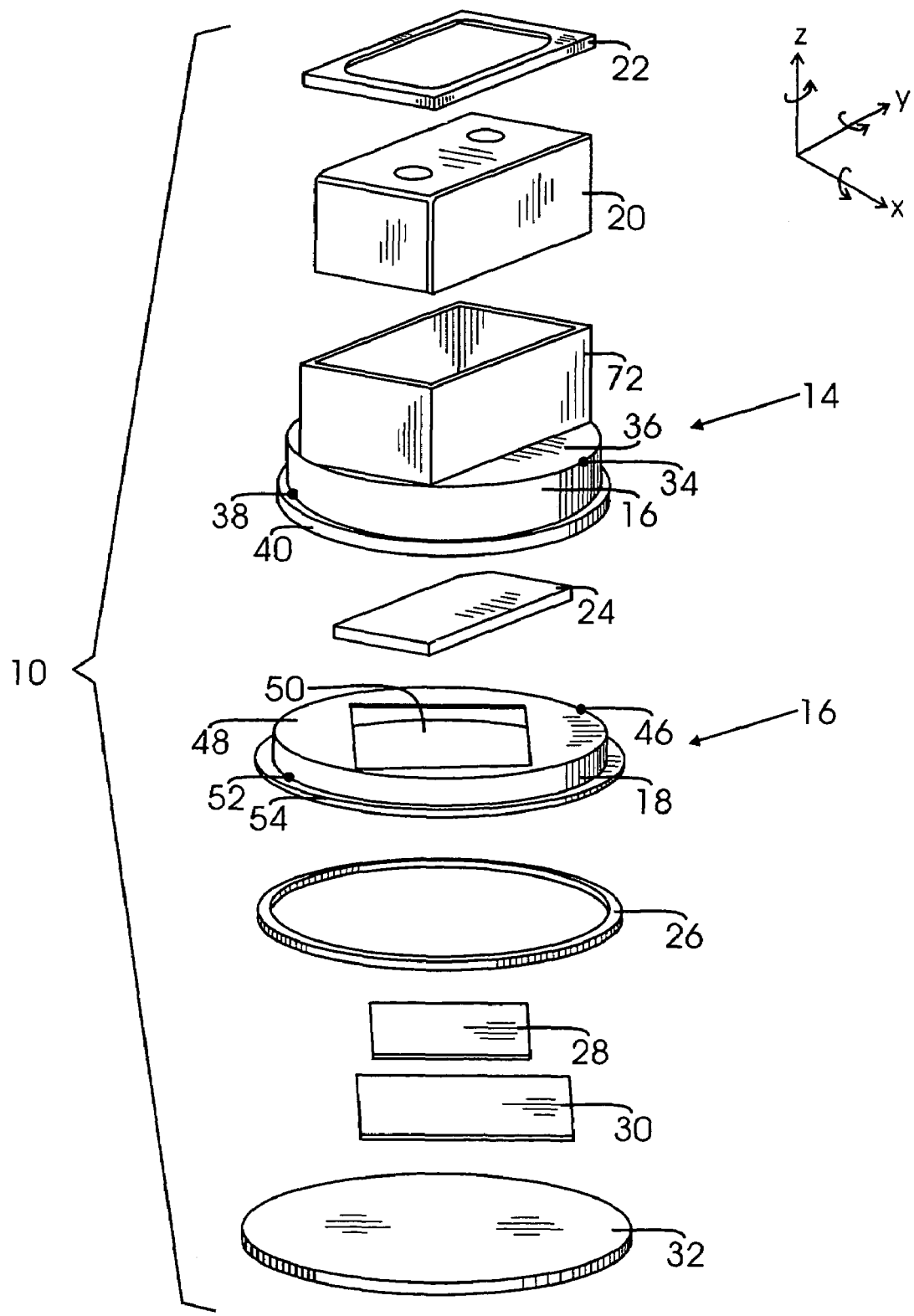
FIG. 1 is an exploded view showing a focal point array alignable to a lens assembly via upper and lower cold shields.

Referring now to the drawings wherein the showings are for the purposes of illustrating the preferred embodiments of the present invention only, and not for the purposes of limiting the same. For example, FIG. 1 illustrates an exploded view showing a cold shield assembly 10 fabricated in accordance with various aspects of the present invention discussed herein. In particular, lower and upper cold shields 14, 16 are illustrated as having cylindrical walls 18, 20. However, it is further contemplated within the scope of the present invention that the walls 18, 20 of the upper and lower cold shields 14, 16 may have different configurations such as octagonal or pentagonal. Accordingly, various aspects of the present invention illustrated by the drawings are not meant to limit the scope of the present invention but are only provided for purposes of illustrating the preferred embodiments of the present invention.

FIG. 1 is also an illustration of a thermal imaging device which is cryogenically cooled during use. The device has an upper cold shield 14 which may house a multiple element lens assembly 21 held in place by a cap 22. The device further has a lower cold shield 16 which has attached thereto various components, namely a filter 24, mounting ring 26, focal plane array 28, read out integrated circuit 30 and mounting plate 32. The lens assembly 20 is aligned and fixed to the focal plane array 28 via an interface between the upper cold shield 14 and the lower cold shield 16. In particular, the upper cold shield 14 has a cylindrical wall 16 defined by a hollow cylinder. An upper edge 34 of the cylindrical wall 16 may have a plate 36 attached thereto. At the lower edge 38 of the cylindrical wall 16, an outwardly radiating flange 40 may be attached thereto. The cylindrical wall 16 may define an inner surface 42 (see FIG. 2). The lower cold shield 14 may have a corresponding cylindrical wall 20 which defines an outside surface 44 (see FIG. 2). The lower cold shield cylindrical wall 18 may be sized and configured to be slightly smaller than the cylindrical wall 16 of the upper cold shield 14 such that the cold shields 14, 16 are free to slide vertically with respect to each other. The cylindrical wall 18 of the lower cold shield 16 may define an upper edge 46 with a plate 48 attached thereto. The plate 48 may further have an aperture 50. Further, a lower edge 52 of the wall 18 may have a flange 54 attached thereto.

Figure 2:
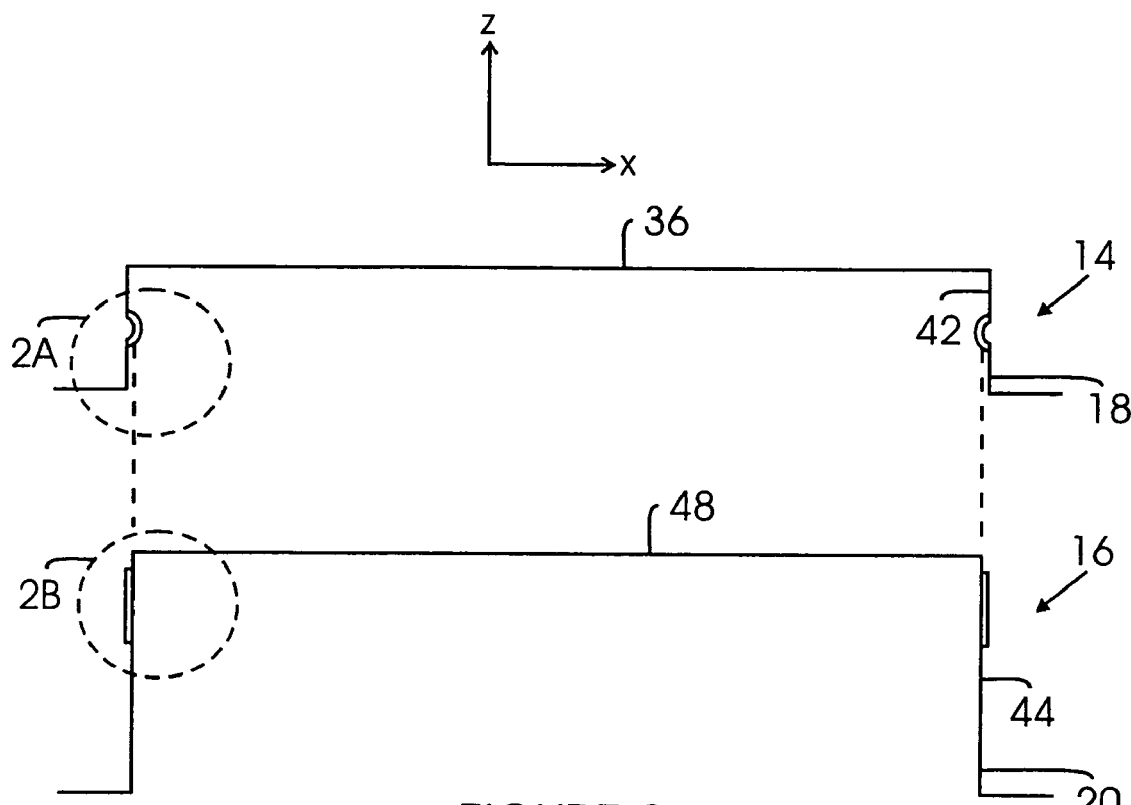
FIG. 2 is a cross-sectional front view of the upper and lower cold shields with bumps and pads formed thereon, respectively.

Referring now to FIG. 2, the same illustrates the lower cold shield 16 positioned below and aligned to the upper cold shield 14. In this regard, an outer diameter of the lower cold shield cylindrical wall 20 is smaller compared to the inner diameter of the upper cold shield cylindrical wall 18. Further, the upper and lower cold shields 14, 16 may have a friction fit therebetween. In this regard, the lower cold shield 16 may slide into the upper cold shield 14. In other words, the upper and lower cold shields 14, 16 may be translated with respect to each other in the Z direction. Further, the upper cold shield 14 may rotate about the Z axis with respect to the lower cold shield 16. The lower cold shield 16 may be inserted into the upper cold shield 14 to the extent that the lower cold shield plate 48 physically contacts the upper cold shield plate 36. As shown more particularly in FIG. 3.

Figure 2A:
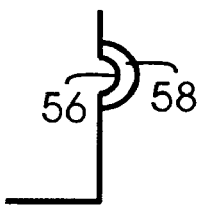
FIG. 2a is a section view of the bump shown in FIG. 2.

Referring now to FIG. 2A, the upper cold shield cylindrical wall 18 may have formed thereon a plurality of bumps 56. These bumps 56 may be disposed about the cylindrical wall 18 in a symmetrical manner (see FIG. 4). And, preferably, at least three bumps 56 are formed on the cylindrical wall 18. Further, the bumps 56 may be formed on the cylindrical wall 18 so as to protrude inwardly therefrom. More particularly, the bumps 56 preferably have a rounded peak (see FIG. 2A), although other peak configurations are contemplated within the scope of the present invention such as a pointed peak and flat top peak. The bumps 56 may further be coated with an indium solder 58 having a thickness of about 0.002 inches which evenly covers the bump 56 on the inside surface 42 of the upper cold shield 14. The cylindrical wall 20 of the lower cold shield 16 may have a plurality of pads 60 formed thereon. In particular, the pads 60 may be indium solder which may be wetted onto an external surface 44 of the cylindrical wall 20. The pads 60 may be positioned about the cylindrical wall 20 to receive the bumps 56 of the upper cold shield 14 when the upper and lower cold shields 14, 16 are aligned to each other. Further, the area (i.e., height and width) of the pad 60 may be sufficiently large to allow translation and rotation about the Z axis between the upper and lower cold shields 14, 16 such that the lens assembly 21 mounted onto the upper cold shield 14 may be aligned to the focal plane array 28 mounted to the lower cold shield 16 while the bumps 56 maintain contact with the pads 60.

Figure 2B:
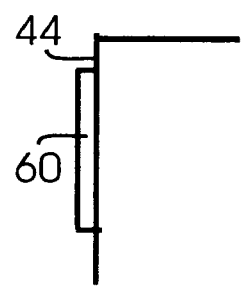
FIG. 2b is a section view of the pad shown in FIG. 2.

As shown in FIG. 2a, the bumps 56 may be formed on the upper cold shield cylindrical wall 18 by forming an indentation or otherwise stamping such bumps 56 onto the cylindrical wall 18. Thereafter, the inside surface 42 of the cylindrical wall 18 at the bump locations may be coated with the indium solder. The thickness of the coated indium solder may be about 0.002 inches thick. As shown in FIG. 2b, indium solder 62 may be coated over the outside surface 44 of the cylindrical wall 20 at selective locations such that the pads 60 receive the bumps 56 (i.e., physical contact) when the lens assembly 21 is aligned with the focal plane array 28. It is also contemplated within the scope of the present invention that other types of solder may be used. Also, preferably, the indium solder is fluxless.

Figure 3:
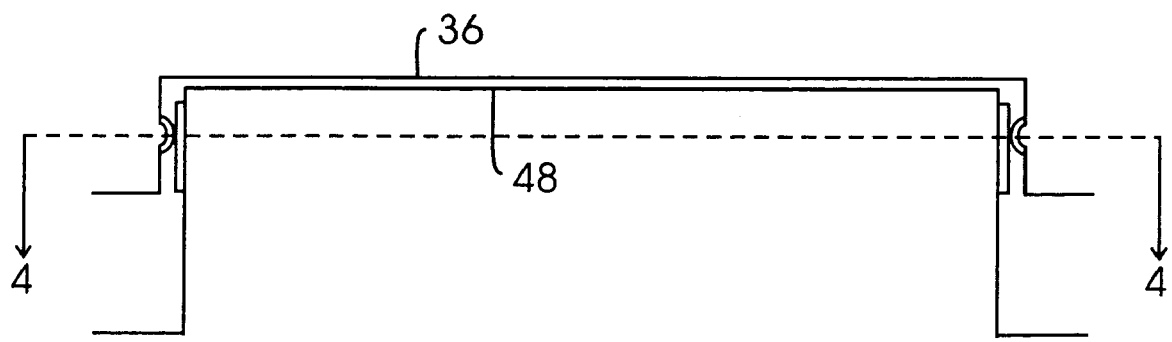
FIG. 3 is an assembled view of the upper and lower cold shields of FIG. 2 wherein the pads receive the bumps.
Figure 4:
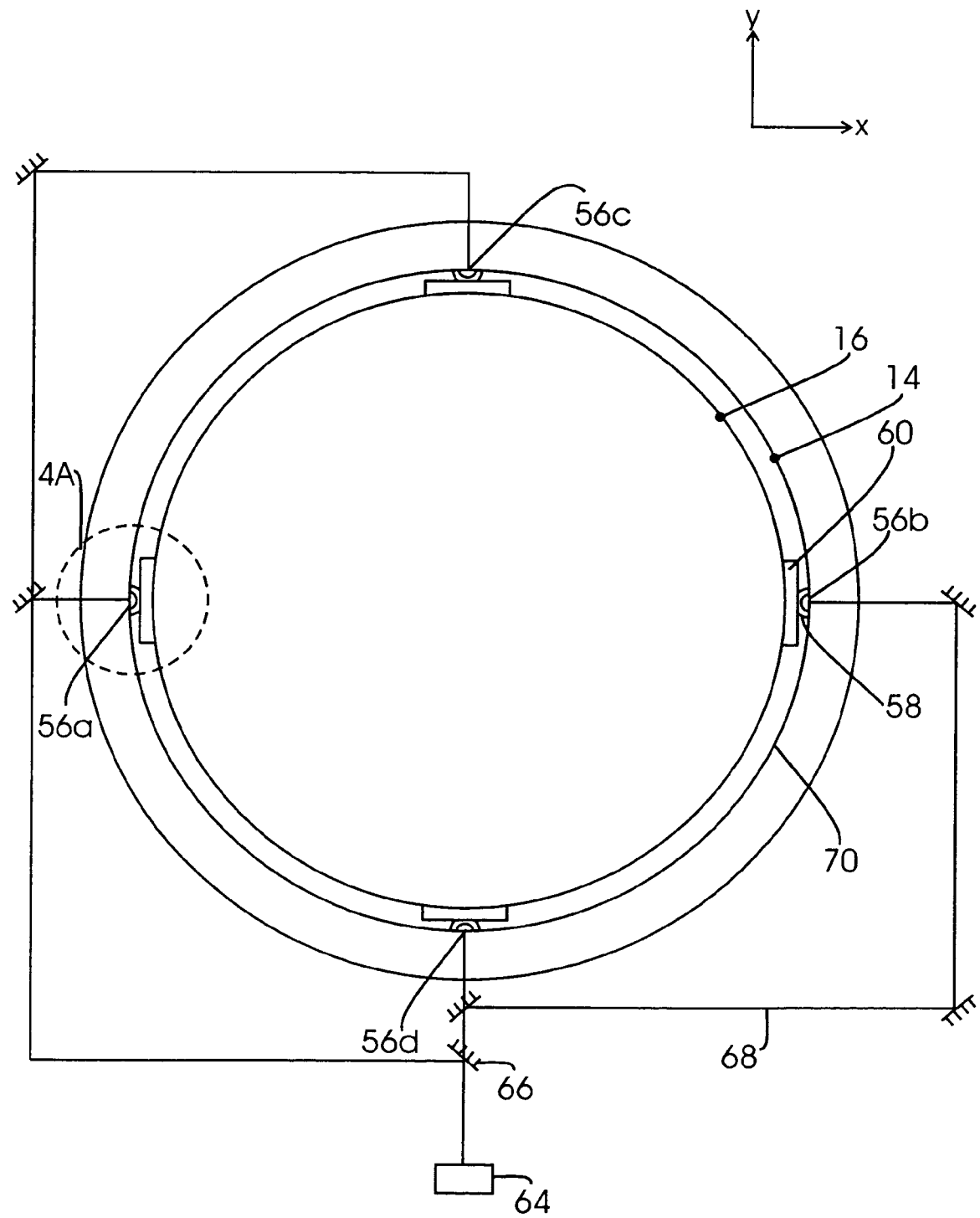
FIG. 4 is a cross-sectional top view of FIG. 3 further illustrating a laser beam/mirror system directed to each of the bumps.
Figure 4A:
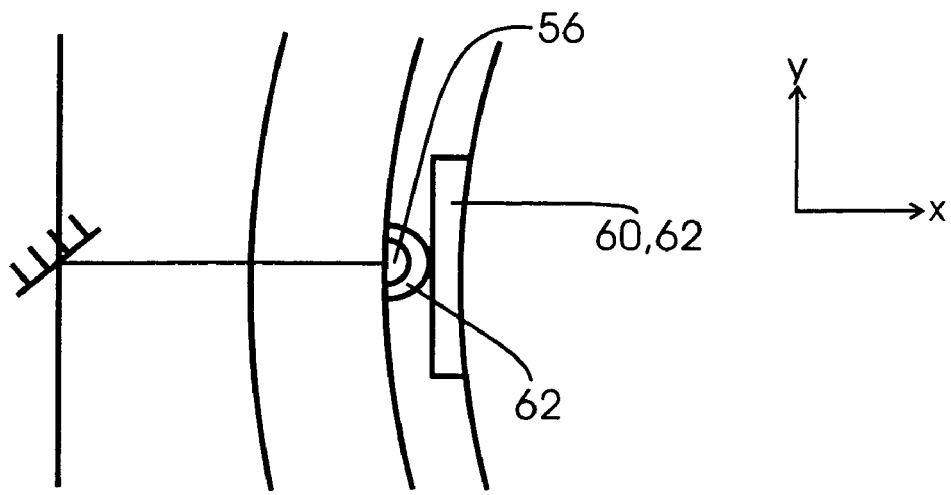
FIG. 4a is a section view of the bump and pad of FIG. 4.

FIG. 4 illustrates a cross-sectional top view of the cold shields 14, 16 shown in FIG. 3. In particular, this Figure illustrates that the upper and lower cold shields 14, 16 are in physical contact with each other via the indium solder 58. More particularly, referring now to FIG. 4A, the bump 56 is coated with indium solder 62 and the coated indium solder 62 is received onto the pad 60 of indium solder 62.

At this point, the upper and lower cold shields 14, 16 are not permanently attached to each other in the sense that rotation and translation about the Z axis is still possible between the upper and lower cold shields 14, 16. The contact between the bumps 56 and pads 60 via the indium solder 62 limit or eliminate translation along the X and Y axis, although rotations about the X and Y axes are still possible between the upper and lower cold shields 14, 16. Accordingly, the lens assembly 21 may be aligned to the focal plane array 28 by adjusting or positioning the upper cold shield 14 with respect to the lower cold shield 16 in the following degrees of freedom; Z axis rotation, Z axis translation, X axis rotation and Y axis rotation. This positioning between the upper and lower cold shield 14, 16 may be accomplished while these parts 14, 16 along with the lens assembly 21 and focal plane array 28 have their temperatures lowered to cryogenic levels. After alignment between the lens assembly 21 and the focal plane array 28 has been established, the solder 62 may be re-flowed such that the upper cold shield 14 is now permanently attached to the lower cold shield 16. Once the cold shields 14, 16 are permanently attached, the upper cold shield 14 may not be rotated or translated with respect to the lower cold shield 16 unless a subsequent process re-flows the solder 62 or the soldered connection is fractured.

The solder 62 may be initially re-flowed with a localized heat at the location of the bumps 56. For example, after the upper and lower cold shield 14, 16 are cooled to cryogenic temperature levels and positioned with respect to each other to obtain alignment between the lens assembly 21 and focal plane array 28, a system of laser 64 and mirrors 66 may be set about the upper and cold shields 14, 16 such that a laser beam 68 may direct localized heat to the bumps 56 on the cylindrical wall outside surface 70 of the upper cold shield 14. Further, the application of the laser beam at all of the bumps 56 may be done simultaneously. It is further contemplated within the scope of the present invention that the laser beam 68 may be applied to each one of the bumps 56 successively, but it is preferable that the laser beam 68 is applied to all of the bumps 56 simultaneously, as shown in FIG. 4. Further, it is further contemplated within the scope of the present invention that the laser beam 68 may be applied to the bumps 56 in a symmetrical manner. In particular, referring to FIG. 4, the laser beam 68 may be applied to the left and right bumps 56a, 56b simultaneously and subsequently the laser beam 68 may be applied to the upper and lower bumps 56c, 56d simultaneously. In effect, this process maintains the forces acting on the upper and lower cold shields 14, 16 in a symmetrical manner to further enhance the alignment accuracy between the lens assembly 21 and focal plane array 28. The method of directing the laser beam 68 to the bumps 56 may alternatively be accomplished with a hot poker raised to a sufficiently high temperature so as to melt the indium solder 62.

Figure 5:
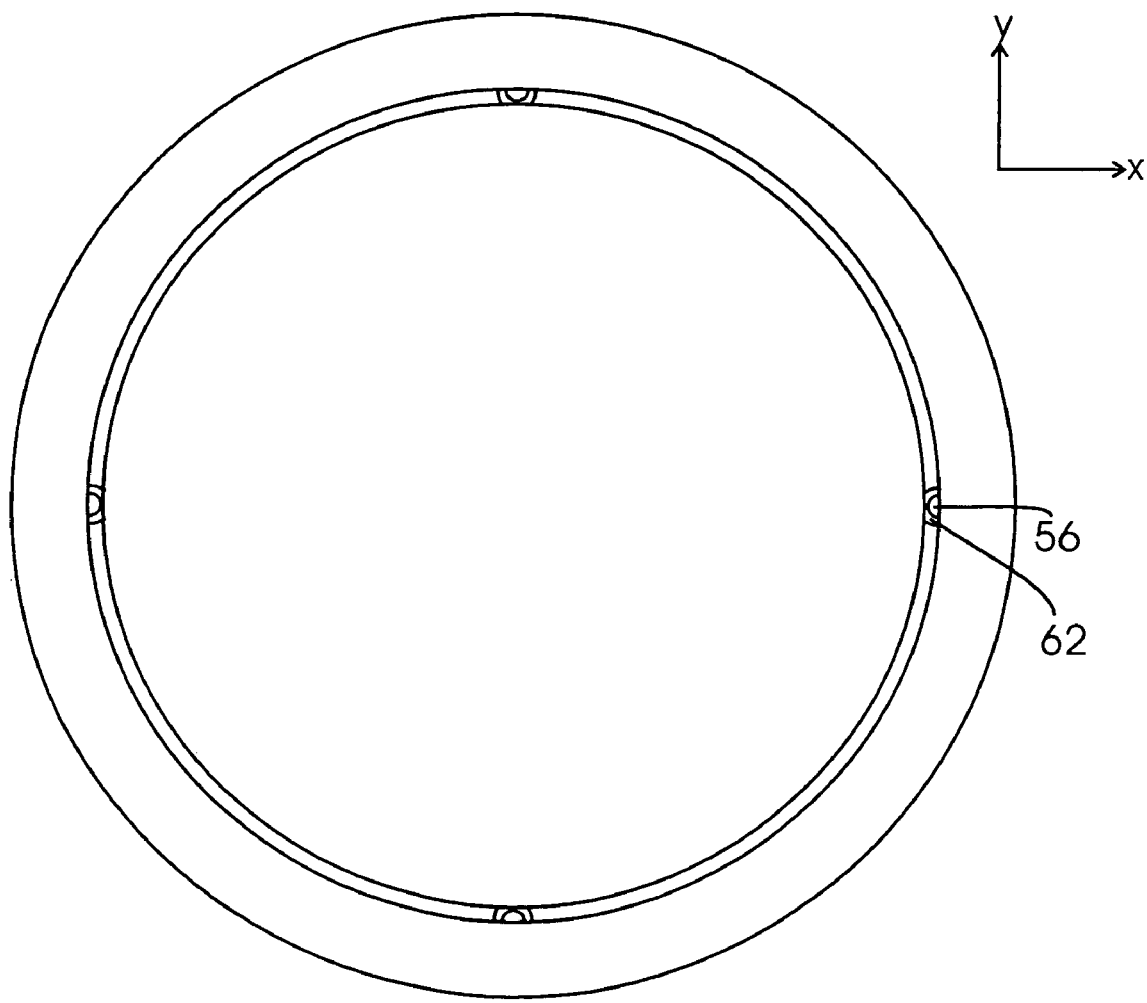
FIG. 5 is a view of FIG. 4 after indium solder covering the bump and pads has been re-flowed.

FIG. 5 illustrates a cross-sectional top view of the upper and lower cold shields 14, 16 after the solder 62 has been re-flowed. In particular, the bumps 56 are now physically in contact with the cylindrical wall outside surface 44 of the lower cold shield 16. Further, the bumps 56 may be frictionally engaged to the lower cold shield cylindrical wall 18.

In an aspect of the present invention, a method of aligning the lens assembly 21 to a focal plane array 28 via upper and lower cold shields 14, 16 will be discussed. In particular, the upper cold shield 14 houses the lens assembly 21 within a lens holder 72 (see FIG. 1). The lens assembly 21 is held within the lens holder 71 with the cap 22 which is fixedly attached to the lens holder 71. The focal plane array 28 is interposed between the lower cold shield 16 and the mounting plate 32. In the method of aligning the lens assembly 21 to the focal plane array 28, the first step is to provide the upper cold shield 14 which holds the lens assembly 21. The second step is to provide the lower cold shield 16 which holds the focal plane array 28. Thereafter, in a third step (i.e., mounting step), the upper cold shield 14 may be mounted onto the lower cold shield 16 which have been provided. In this regard, the cylindrical wall 18 of the lower cold shield 16 may slide into the cylindrical wall 16 of the upper cold shield 14 in the Z direction. At this point, the upper cold shield 14 may rotate in the Z direction and translate in the Z direction freely. The upper cold shield 14 may have limited freedom to rotate about the X and Y axes with little to no freedom to translate about the X and Y axes. The reason being that the bumps 56 are received onto the pads 60 to limit the X and Y translation of the upper and lower cold shields 14, 16. In a fourth step, the lowering step, the temperature of the upper and lower cold shields 14, 16 along with the lens assembly 21 and focal plane array 28 may be lowered to a cryogenic temperature level. While the upper and lower cold shields 14, 16 are at the cryogenic temperature levels, the upper cold shield 14 may be translated with respect to the lower cold shield 16 until the lens assembly 21 is precisely aligned to the focal plane array 28. In a sixth step, the fixing step, the upper cold shield 14 may be fixed to the lower cold shield 16 while the upper and lower cold shields 14, 16 are maintained at cryogenic temperature levels. This fixing step may include the use of a system of laser 64 and mirrors 66 to direct a focused beam 68 of energy to a localized spot (i.e., bump 56) to reflow indium solder 62 coated on the bump 56 and pad 60. Preferably, the laser beam 68 is applied to all of the bumps 56 formed on the upper cold shield 14 simultaneously. In the alternative, the laser beam 68 may be applied to the bumps 56 in a symmetrical manner. For example, as shown in FIG. 5, there are four bumps 56a, b, c, d which are located at an upper and lower end, left side, right side of the upper cold shield 14. In this regard, the laser beam 68 may be applied simultaneously to the left and right bumps 56a, b only, and thereafter the laser beam 68 may be simultaneously directed to the upper and lower bumps 56c, d.

This description of the various embodiments of the present invention is presented to illustrate the preferred embodiments of the present invention, and other inventive concepts may be otherwise variously embodied and employed. By way of example and not limitation, although reference to only an imaging device has been made throughout this DETAILED DESCRIPTION OF THE INVENTION to describe the various aspects of the present invention, such aspects may also be incorporated or employed to non-imaging devices/applications. The appended claims are intended to be construed to include such variations except insofar as limited by the prior art.

What is claimed is:

1. A method of aligning a lens assembly to a focal plane array, the method comprising the steps of:
   a. providing an upper cold shield for holding the lens assembly;
   b. providing a lower cold shield for holding the focal plane array;
   c. mounting the upper cold shield onto the lower cold shield;
   d. lowering the temperature of the upper and lower cold shields to a cryogenic level;
   e. translating the upper cold shield with respect to the lower cold shield until the lens assembly is aligned to the focal plane array while the upper and lower cold shields are at cryogenic temperature levels; and
   f. fixing the upper cold shield to the lower cold shield while the upper and lower cold shields are maintained at cryogenic levels.

2. The method of claim 1 wherein the upper cold shield has a plurality of bumps formed on an inner surface thereof and the lower cold shield has a plurality of pads formed on an outer surface thereof to receive the bumps, and the bumps and pads are coated with an indium solder.

3. The method of claim 2 wherein the fixing step comprises the steps of:
   a. applying a localized heat to bumps to reflow the solder coated on the bumps and pads.

4. The method of claim 3 wherein the localized heat is applied to all of the bumps simultaneously.

5. The method of claim 4 wherein the localized heat is applied via a laser beam.

6. A cold shield assembly for shielding a cryogenic camera including a lens assembly and a focal plane array, the cold shield assembly comprising:
   a. an upper cold shield for holding the lens assembly, the upper cold shield being coolable to cryogenic temperatures;
   b. a lower cold shield for holding the focal plane array, the lower cold shield being coolable to cryogenic temperatures; and
   c. a plurality of cryogenically stable soldering points that permanently attach the lower cold shield to the upper cold shield.

7. A cold shield assembly for shielding a cryogenic camera including a lens assembly and a focal plane array, the cold shield assembly comprising:
   an upper cold shield for holding the lens assembly, the upper cold shield defines an inner surface with a plurality of bumps formed thereon;
   a lower cold shield for holding the focal plane array, the lower cold shield defines an outer surface with a plurality of pads formed thereon to receive the plurality of bumps; and
   a plurality of cryogenically stable soldering points that permanently attach the lower cold shield to the upper cold shield.

8. The cold shield assembly of claim 7 wherein the upper cold shield has a cylindrical wall and the bumps are formed symmetrically about the cylindrical wall.

9. The cold shield assembly of claim 8 wherein the lower cold shield has a cylindrical wall and the pads are formed symmetrically about the cylindrical wall.

10. The cold shield assembly of claim 9 wherein the bumps have an interference fit with respect to the pads.

11. The cold shield assembly of claim 7 wherein the bumps directly contact the pads and the solder circumscribes the bumps.

12. The cold shield assembly of claim 7 wherein the bumps have a rounded peak.

13. The cold shield assembly of claim 7 wherein the pads conform to the wall.

14. The cold shield assembly of claim 7 wherein the bumps and pads are coated with solder.

15. The cold shield assembly of claim 8 wherein the solder is indium solder.

16. A cold shield assembly for shielding a cryogenic camera including a lens assembly and a focal plane array, the cold shield assembly comprising:
   an upper cold shield for holding the lens assembly;
   a lower cold shield for holding the focal plane array; and
   a plurality of cryogenically stable soldering points that permanently attach the lower cold shield to the upper cold shield;
   wherein at least one of the upper and lower shields is transmissive to laser heat
   energy to re-flow solder located at the soldering points.

17. The cold shield assembly of claim 16 wherein the soldering points are arranged at positions subject to localized heating by a laser beam.

18. The cold shield assembly of claim 17 wherein the positions are subject to at least one of symmetric and simultaneous localized heating by the laser beam.

19. A cold shield assembly for shielding a cryogenic camera including a lens assembly and a focal plane array, the cold shield assembly comprising:
   an upper cold shield for holding the lens assembly;
   a lower cold shield for holding the focal plane array; and
   a plurality of cryogenically stable soldering points that permanently attach the lower cold shield to the upper cold shield;
   wherein, during assembly, the upper and lower cold shields are temporarily held together by contact friction which allows limited translation and rotation of the lower cold shield within the upper cold shield to enable alignment between the lens assembly and the focal plane array.

* * * * *